United States Patent
Huang et al.

(10) Patent No.: US 8,372,752 B1
(45) Date of Patent: Feb. 12, 2013

(54) METHOD FOR FABRICATING ULTRA-FINE NANOWIRE

(75) Inventors: Ru Huang, Beijing (CN); Shuai Sun, Beijing (CN); Yujie Al, Beijing (CN); Jiewen Fan, Beijing (CN); Runsheng Wang, Beijing (CN); Xiaoyan Xu, Beijing (CN)

(73) Assignee: Peking University (CN)

( * ) Notice: Subject to any disclaimer, the term of this patent is extended or adjusted under 35 U.S.C. 154(b) by 0 days.

(21) Appl. No.: 13/543,704

(22) Filed: Jul. 6, 2012

Related U.S. Application Data

(63) Continuation of application No. PCT/CN2011/083254, filed on Nov. 30, 2011.

(51) Int. Cl.
*H01L 21/302* (2006.01)
*H01L 21/461* (2006.01)

(52) U.S. Cl. .................. 438/704; 438/719; 438/756

(58) Field of Classification Search .......... 438/704, 438/719, 756
See application file for complete search history.

(56) References Cited

U.S. PATENT DOCUMENTS

| | | | | |
|---|---|---|---|---|
| 6,231,744 B1 * | 5/2001 | Ying et al. | | 205/324 |
| 7,335,395 B2 * | 2/2008 | Ward et al. | | 427/198 |
| 7,696,105 B2 * | 4/2010 | Lee et al. | | 438/753 |
| 7,713,849 B2 * | 5/2010 | Habib et al. | | 438/479 |
| 8,080,481 B2 * | 12/2011 | Lee et al. | | 438/758 |
| 2005/0253138 A1 * | 11/2005 | Choi et al. | | 257/40 |
| 2006/0088960 A1 * | 4/2006 | Saito et al. | | 438/149 |
| 2006/0177977 A1 | 8/2006 | Chan et al. | | |
| 2009/0124097 A1 | 5/2009 | Cheng | | |
| 2009/0152598 A1 * | 6/2009 | Baek et al. | | 257/253 |
| 2010/0213579 A1 * | 8/2010 | Henry et al. | | 257/623 |
| 2012/0190202 A1 * | 7/2012 | Huang et al. | | 438/694 |

FOREIGN PATENT DOCUMENTS

| | | |
|---|---|---|
| CN | 102086024 A | 6/2011 |
| CN | 102214586 A | 10/2011 |

* cited by examiner

*Primary Examiner* — Jarrett Stark
*Assistant Examiner* — Nicholas Tobergte
(74) *Attorney, Agent, or Firm* — Bret E. Field; Bozicevic, Field & Francis LLP

(57) ABSTRACT

Disclosed herein is a method for fabricating an ultra fine nanowire, which relates to a manufacturing technology of a microelectronic semiconductor transistor. This method obtains a suspended ultra fine nanowire base on a combination of a mask blocking oxidation process and a stepwise oxidation process. A diameter of the suspended ultra fine nanowire fabricated by this method is precisely controlled to 20 nm by controlling a thickness of a deposited silicon nitride film and a time and temperature of the two oxidation process. Since a speed of a dry oxidation process is slower, the size of the final nanowire may be precisely controlled. This method can be used to fabricate an ultra fine nanowire with a lower cost and a higher applicability.

6 Claims, 3 Drawing Sheets

METHOD FOR FABRICATING ULTRA-FINE NANOWIRE

The present application claims priority to Chinese Patent Application No. 201110339762.0, filed on Nov. 1, 2011 in the State Intellectual Property Office of People's Republic of China, which is incorporated herein by reference in its entirety.

FIELD OF THE INVENTION

The invention relates to a manufacturing technology of a microelectronic semiconductor transistor, and particularly relates to a method for fabricating an ultra-fine nanowire base on a combination of a mask blocking oxidation process and a stepwise oxidation process.

BACKGROUND OF THE INVENTION

With a development of an integrated circuit industry, a higher integration degree is required more than often, and a feature size of a field effect transistor is required to be scaled down continuously while a better performance and a lower production cost are desirable. In the production, a photolithography technology is faced with more and more requirements. Among photolithography processes, an electronic beam photolithography process is more widely used in fabricating a fine nanowire due to a good control of a size and preciseness of a pattern. However, it also has some disadvantages such as a low efficiency and a high cost, which limit an application of the electronic beam photolithography into a mass industry production. Moreover, in the electronic beam photolithography process, an electron scattering is occurred, causing a proximity effect and more challenges to fabricate a nanowire less than 20 nm.

SUMMARY OF THE INVENTION

A purpose of an embodiment of the invention is to provide a method for fabricating an ultra-fine nanowire base on a combination of a mask blocking oxidation process and a stepwise oxidation process.

A technical solution of the embodiment of the invention is as follows.

An embodiment of the present invention provides a method for fabricating an ultra-fine nanowire. The method includes the following steps.

(1) Fabricating a blocking layer for the oxidation process over a substrate.

A main purpose of this step is to fabricate the blocking layer on a surface of a silicon nanowire for the subsequent oxidation process. A silicon nitride film may be used as the blocking layer. A thickness of the blocking layer determines a thickness of an oxidized surface of the silicon nanowire during the oxidation process. The following process steps may be used:

(a) depositing the silicon nitride film over the substrate;

(b) coating a photoresist layer onto the silicon nitride film, and performing a photolithography process to define a region to be used as a hard mask of the silicon nanowire;

(c) performing a dry etching process to transfer a pattern of the photoresist to the silicon nitride film; and (d) removing the photoresist layer.

(2) Performing a dry etching process on the substrate to obtain an initial line, and performing a wet oxidation process to form a fine nanowire.

A main purpose of this step is to oxidize the nanowire by using a wet oxidation process so that the nanowire is slimmed by oxidation. Meanwhile, since there remains the silicon nitride film on the top of the nanowire, an oxidation of the top of the silicon nanowire is blocked, but a side surface of the silicon nanowire is oxidized. An oxide layer at the side surface has a thickness much larger than that of an oxide layer on the top. In this step, an oxidation time and a temperature determine a width of the nanowire.

(3) Removing the hard mask on the top of the nanowire by using a wet etching, and performing a dry oxidation process on the nanowire to obtain a suspended silicon nanowire.

A main purpose of this step is to remove the hard mask on the top of the nanowire by using a wet etching, and then oxidize the nanowire obtained after the wet etching process by performing a dry oxidation process, so as to obtain a nanowire with a smaller size. In this step, since the silicon nitride mask is removed, the material on the top is not blocked from oxidizing, while the top and the side portions of the nanowire are simultaneously oxidized, so that a size of the resultant nanowire is further reduced. An oxidation time and an oxidation temperature in this step determine the size of the resultant nanowire.

This step mainly includes the following process:

a. performing a wet etching process on the nanowire obtained in the step (2) to remove the silicon nitride film on the top of the nanowire;

b. performing a dry oxidation process on the nanowire obtained in the above step; and c. removing the oxide layer surrounding the nanowire by using a wet etching process.

In the above method, the deposition of the silicon nitride film is performed by a low pressure chemical vapor deposition method, the application of the photoresist is performed by a typical photolithography, the etching of the silicon nitride film and the substrate is performed by using an anisotropic dry etching technology, and the wet etching of the silicon nitride mask is performed by using a heated concentrated phosphoric acid. The wet etching of the oxide layer is performed by using a hydrogen fluoride solution.

According to the embodiment of the present invention, the following advantages may be obtained.

In an integrated circuit fabrication process, since an integration degree becomes higher, a size of a nanowire becomes smaller while the production cost is also required to be reduced. If a fine nanowire is fabricated by using an electronic beam photolithography process and an etching process, the production cost is high, and it is disadvantageous in terms of industry production. If the nanowire is oxidized by using an oxidation process only, a reaction time is elongated, and the production and the application are limited in seeking an efficiency of the industry production. The present invention provides a process method for fabricating an ultra-fine nanowire by using a hard mask for blocking the oxidation in combination with a stepwise oxidation process. By using a first oxidation, both side portions of the initial nanowire are slimmed rapidly, so that the nanowire is easily to be suspended in a subsequent oxidation. By using a second oxidation, the hard mask for blocking the oxidation of the top of the nanowire is removed, so that the top and the side portions of the nanowire are simultaneously oxidized, and thus a size of the resultant nanowire is further reduced. A diameter of the suspended ultra fine nanowire fabricated by this method is precisely controlled to 20 nm by the thickness of the deposited silicon nitride film and a control of the time and the temperature of the two oxidation process. Also, since the speed of the dry oxidation process is slow, the size of the final fine nanowire may be precisely controlled. Further, this method can be applied to fabricate an ultra fine nanowire with a lower cost and a higher applicability.

BRIEF DESCRIPTION OF THE DRAWINGS

In the drawings, FIG. 1(a) shows a step of depositing a silicon nitride film over a substrate; FIG. 1(b) shows a step of coating a photoresist; FIG. 1(c) shows a step of performing a photolithography process; FIG. 1(d) shows a step of performing a dry etching process on the silicon nitride film to remain a silicon nitride film pattern over the substrate; FIG. 1(e) shows a step of removing the photoresist; FIG. 1(f) shows a step of performing a dry etching process on the substrate; FIG. 1(g) shows a step of performing a wet oxidation process to slim the nanowire by oxidation; FIG. 1(h) shows a step of removing the silicon nitride mask on the top by performing a wet etching process; FIG. 1(i) shows a step of oxidizing the nanowire by a dry oxidation process to form a suspended fine nanowire; and FIG. 1(j) shows a step of removing a silicon oxide layer surrounding the nanowire by using a wet etching process, so as to finally fabricate the fine nanowire.

Figure 1:
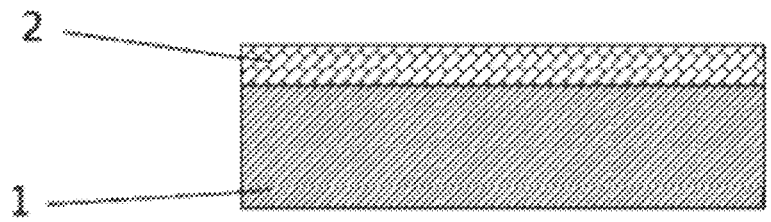
FIGS. 1(a)-1(j) are schematic views showing a flow of processes for fabricating an ultra-fine nanowire base on a combination of a mask blocking oxidation process and a stepwise oxidation process.
Figure 1:
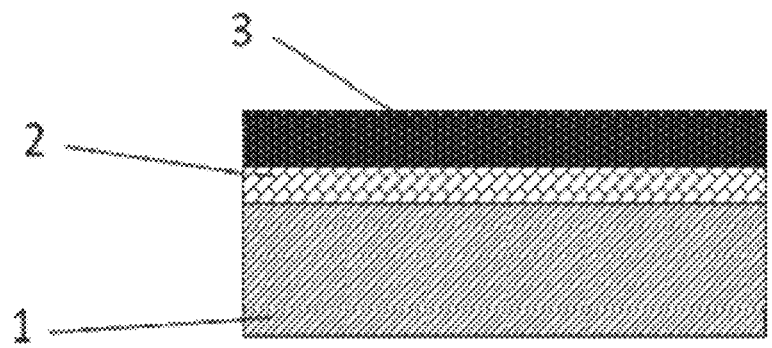
Figure 1:
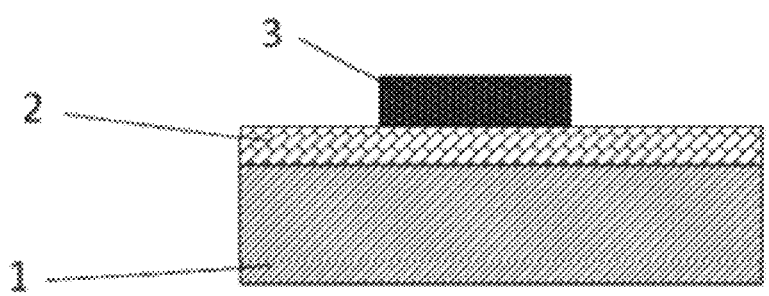
Figure 1:
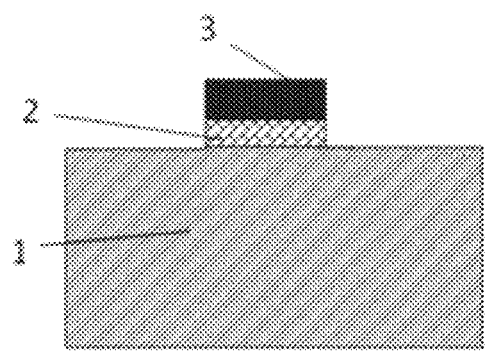
Figure 1:
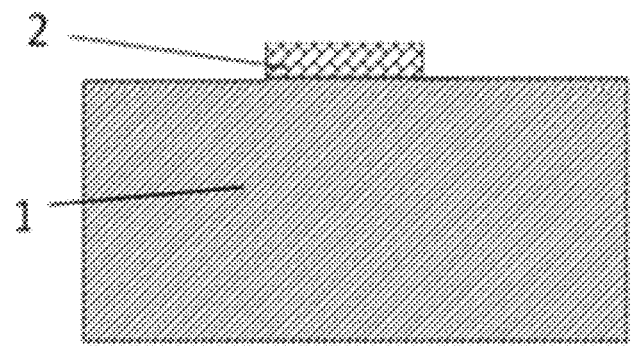
Figure 1:
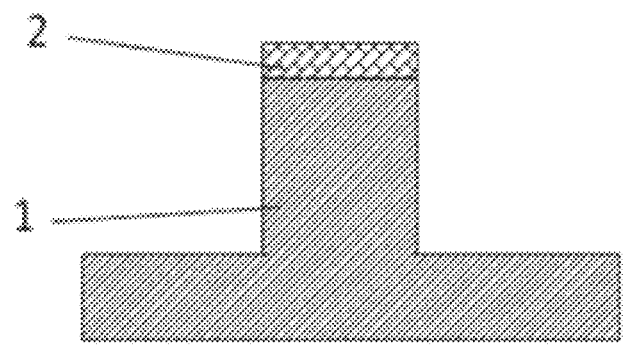
Figure 1:
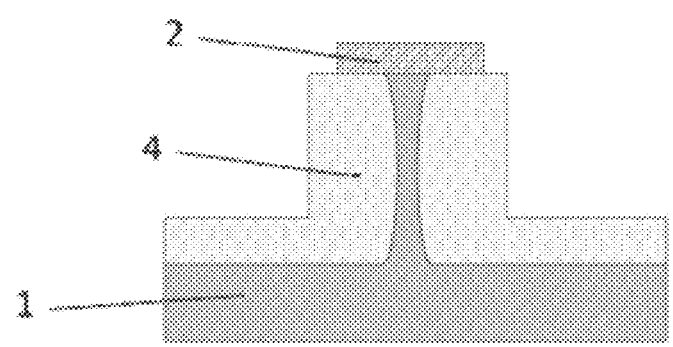
Figure 1:
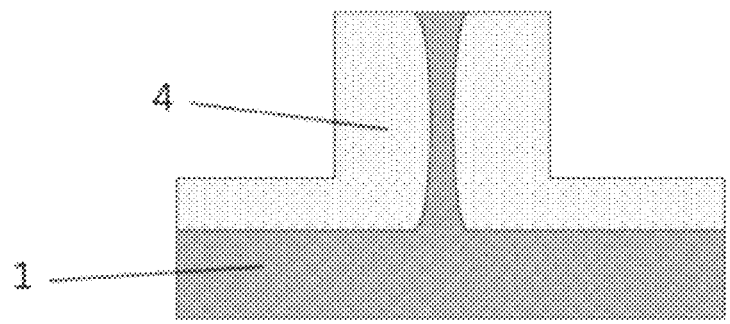
Figure 1:
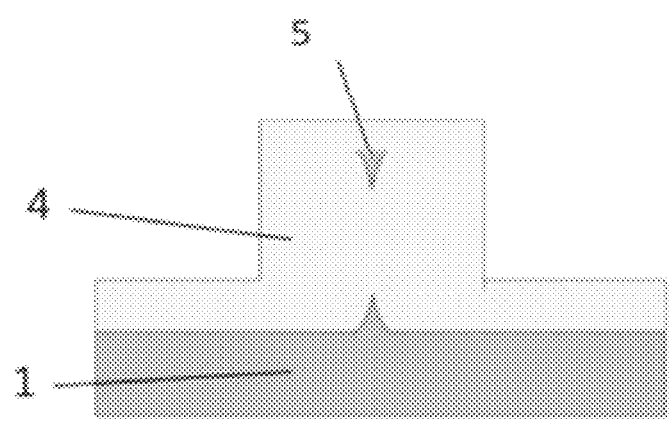

In the drawings, reference sign "1" represents a substrate; reference sign "2" represents a silicon nitride; reference sign "3" represents a photoresist layer; reference sign "4" represents a silicon oxide; and reference sign "5" represents a fine nanowire made of a material of the substrate.

DETAILED DESCRIPTION OF THE EMBODIMENTS

Hereinafter, a further description of the present invention will be given through drawings and specific examples.

An ultra fine nanowire with a diameter of about 20 nm can be obtained according to the following steps.

1. As shown in FIG. 1(a), a silicon nitride film with a thickness of 1500 Å is deposited over a silicon substrate by using a low pressure chemical vapor deposition process.

2. A photoresist is coated onto the silicon nitride film, as shown in FIG. 1(b).

3. A photolithography process is performed to define a region to be used as a mask pattern of a silicon nanowire, as shown in FIG. 1(c).

4. The silicon nitride film of 1500 Å is etched by using a dry anisotropic etching process to finally transfer a pattern of the photoresist onto the silicon nitride film, as shown in FIG. 1(d).

5. The photoresist layer is removed, as shown in FIG. 1(e).

6. The silicon substrate of 3000 Å is etched by using a dry anisotropic etching process, as shown in FIG. 1(f).

7. A wet oxidation process is performed at a temperature of 950° C. for 2 hours to slim a size of the silicon nanowire, as shown in FIG. 1(g).

8. The silicon nitride film of 1500 Å is etched through a heated (170° C.) concentrated phosphoric acid, as shown in FIG. 1(h).

9. A dry oxidation process is performed at a temperature of 925° C. for 6 h to oxidize the silicon nanowire so that the silicon nanowire is suspended, as shown in FIG. 1(i).

Figure 1J:
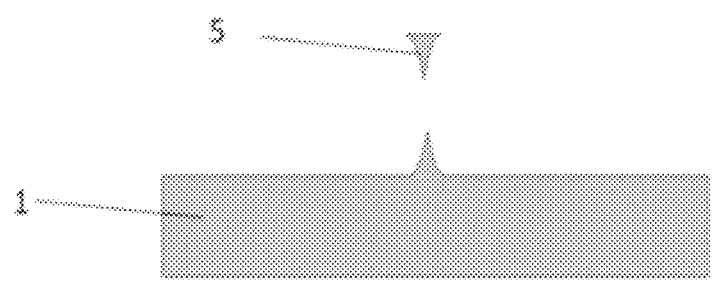

10. As shown in FIG. 1(j), a wet etching process by using a hydrofluoric acid and water (1:10) is performed on a silicon oxide film to dehydrate an entire chip of the silicon, so that the fine line with a finer width is finally obtained.

The specific embodiments of the present invention are not used to limit the invention. Various changes, modifications or equivalents of the embodiments to the technical solution of the present invention can be made by those skilled in the art by using the above-mentioned methods and techniques without departing from the spirit or scope of the invention. Thus, it is intended that the present invention covers all such modifications changes, modifications or equivalents of the embodiments without departing from the spirit or scope of the invention that come within the scope of the appended claims.

What is claimed is:

1. A method for fabricating an ultra fine nanowire, comprising:
    a) depositing a silicon nitride film over a silicon substrate;
    b) coating a photoresist layer onto the silicon nitride film;
    c) performing a photolithography process to define a region to be used as a mask pattern of a silicon nanowire;
    d) etching the silicon nitride film to finally transfer a pattern of the photoresist layer onto the silicon nitride film;
    e) removing the photoresist layer;
    f) performing a dry anisotropic etching process on the silicon substrate;
    g) performing a wet oxidation process to slim a size of the silicon nanowire;
    h) etching the silicon nitride film through a heated concentrated phosphoric acid;
    i) performing a dry oxidation process on the nanowire to oxidize the silicon nanowire so that the silicon nanowire is suspended; and
    j) performing a wet etching process on a silicon oxide film to dehydrate a entire chip of the silicon, so as to finally obtain the fine nanowire with a finer width.

2. The method according to claim 1, wherein, the deposition of the silicon nitride film is performed by a low pressure chemical vapor deposition method.

3. The method according to claim 1, wherein, the application of the photoresist is performed by a typical photolithography.

4. The method according to claim 1, wherein, the etching of the silicon nitride film and the substrate is performed by using an anisotropic dry etching technology.

5. The method according to claim 1, wherein, the wet etching of the silicon nitride film is performed by using a concentrated phosphoric acid with a temperature higher than 170° C.

6. The method according to claim 1, wherein, the wet etching of the oxide layer is performed by using a hydrogen fluoride solution, wherein a hydrofluoric acid and water have a volume ratio of 1:10.

* * * * *

UNITED STATES PATENT AND TRADEMARK OFFICE
CERTIFICATE OF CORRECTION

| | | |
|---|---|---|
| PATENT NO. | : 8,372,752 B1 | Page 1 of 1 |
| APPLICATION NO. | : 13/543704 | |
| DATED | : February 12, 2013 | |
| INVENTOR(S) | : Ru Huang | |

It is certified that error appears in the above-identified patent and that said Letters Patent is hereby corrected as shown below:

On the title page, under INID code no. (63), please insert INID code no. (30) so that it reads:

"(30)    Foreign Application Priority Data

November 1, 2011 (CN) ............................ 201110339762.0"

Signed and Sealed this
Second Day of April, 2013

Teresa Stanek Rea
*Acting Director of the United States Patent and Trademark Office*